United States Patent [19]

Monett

[11] Patent Number: 4,533,881
[45] Date of Patent: Aug. 6, 1985

[54] RAPID STARTING VARIABLE FREQUENCY OSCILLATOR WITH MINIMUM STARTUP PERTURBATIONS

[75] Inventor: Michael R. Monett, Santa Clara, Calif.

[73] Assignee: Memory Technology, Inc., Santa Clara, Calif.

[21] Appl. No.: 414,749

[22] Filed: Sep. 3, 1982

[51] Int. Cl.³ .......................... H03L 7/00; H03B 5/08
[52] U.S. Cl. .............................. 331/36 C; 331/117 R; 331/167; 331/173; 331/177 V
[58] Field of Search .......... 331/36 C, 117 R, 117 FE, 331/167, 168, 173, 177 V

[56] References Cited

U.S. PATENT DOCUMENTS 2,509,235  5/1950  Kandoian ............................ 331/168
2,724,776  11/1955  Sherwin ............................... 331/173

FOREIGN PATENT DOCUMENTS 0341541  11/1959  Fed. Rep. of Germany ...... 331/173

OTHER PUBLICATIONS

Butler, F. "Cathode-Coupled Oscillators" *Wireless Engineer* (Nov. 44), pp. 521-526.

*Primary Examiner*—Eugene R. LaRoche
*Assistant Examiner*—D. C. Mis
*Attorney, Agent, or Firm*—Townsend and Townsend

[57] ABSTRACT

An LC-type oscillator employing a differential amplifier to switch a tank circuit in response to a feedback signal. A voltage controlled variable capacitor is employed to control the frequency of oscillation. The bias across the variable capacitor is closely controlled to avoid errors in the frequency of oscillation during the period of startup, which would otherwise create an undesired error in the oscillation frequency.

5 Claims, 3 Drawing Figures

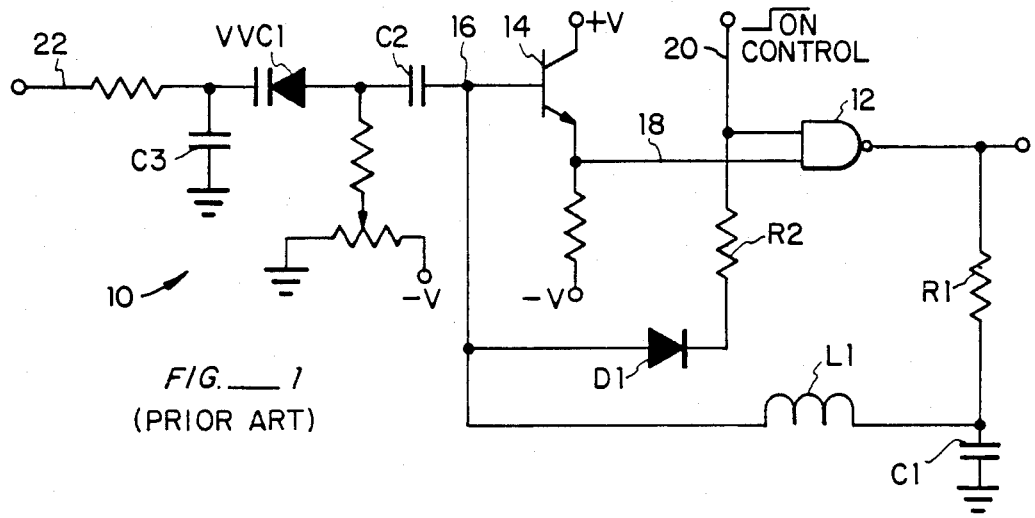
FIG._1
(PRIOR ART)
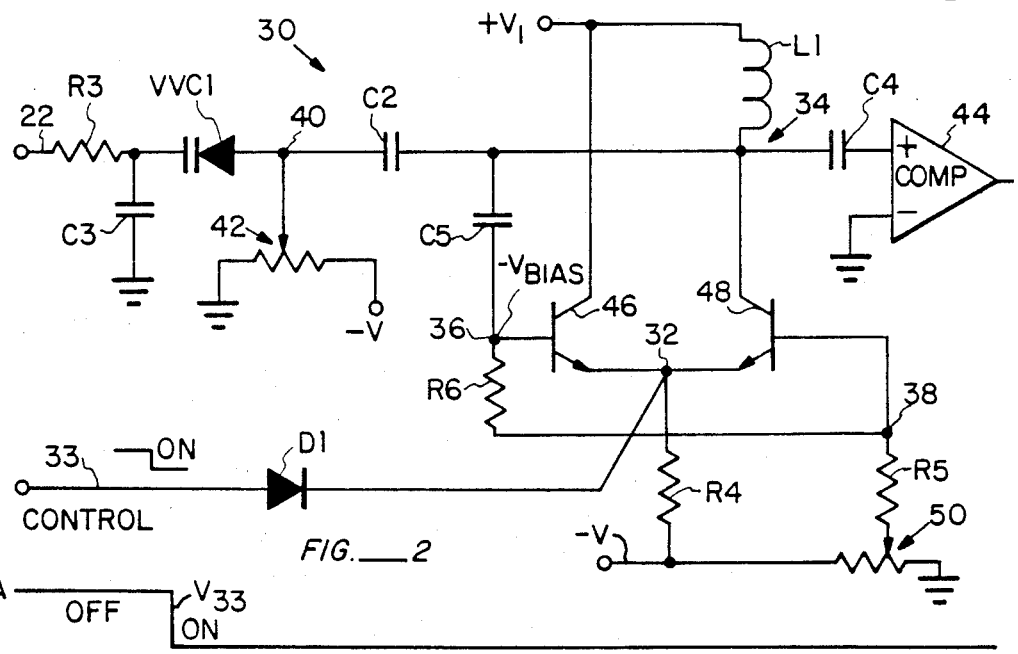
FIG._2
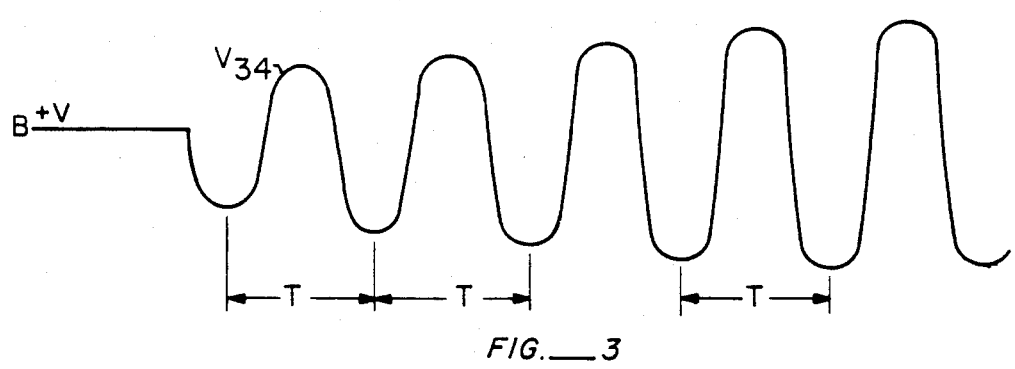
FIG._3

RAPID STARTING VARIABLE FREQUENCY OSCILLATOR WITH MINIMUM STARTUP PERTURBATIONS

BACKGROUND OF THE INVENTION

1. Field of Invention

This invention relates to variable frequency oscillators (VFOs) for use in applications requiring rapid starting, such as in data recovery from magnetic disk recording systems. In addition, such oscillators may be used in data transmission systems which also require the use of tracking oscillators. A particular application of this oscillator device is in the tracking of non-self-clocking data, i.e., data where there is a priori knowledge of the transmission rules based upon which the data can be correctly interpreted.

Where a VFO is used to track data, a certain amount of time is required in order for the VFO to lock to the raw data. The amount of time required is determined by the bandwidth of the VFO feedback control loop, which is largely a function of the time constant of the control loop. During the transition, or lock-in, period, data cannot be accurately read. Therefore, it is imperative that the transition time be minimized so that the VFO can be rapidly locked to the incoming data.

In some applications, for example in the area of phase locked loop detection, it is typical to provide a free-running VFO having a relatively wide bandwidth. The wide bandwidth enables the phase locked loop to more easily lock onto the desired frequency and phase of incoming data. However, increasing the bandwith of the phase locked loop circuit renders the phase locked loop more sensitive to random noise in the data stream, reducing the ability of the phase locked loop to decode accurately incoming data. In order to minimize the random noise it is desirable to decrease the loop bandwidth. However, relatively narrow band phase locked loops using free-running oscillators are subject to false lock conditions. Once the loop is in the false lock condition it cannot recover by itself. Various schemes have been devised which provide a wide bandwidth during the lock-in interval and a narrow bandwidth during the tracking interval. However, such schemes are subject to other undesirable limitations such as undesirable phase transient conditions. What is therefore needed is a variable frequency oscillator which can be stopped and subsequently started in phase with incoming data and which can be employed in a narrow band phase locked loop to take advantage of the improved performance inherent in a narrow-band tracking circuit.

2. Description of the Prior Art

Various variable frequency oscillator circuits are known in the prior art, some of which are described in U.S. Pat. No. 3,810,234 issued in the name of the present inventor. Of particular interest are LC type oscillator circuits which are useful in data recovery systems. Such oscillators as described in the aforementioned patent have now been incorporated in a number of data recovery systems including the Memorex 670 series high speed disk drives. Other versions are found in the Shugart SA-4000 series high speed disk drives, as well the Seagate ST-506 and ST-412 series data storage and recovery systems. The aforementioned patent describes an injection lock oscillator which required a stream of data pulses at start up as a source of synchronization. The Shugart and Seagate devices have related improved technology.

LC oscillator circuits in general are known to provide excellent stability when used in high-noise environments. The energy associated with the oscillations in an LC circuit provide a "flywheel" effect which tends to maintain a VFO operating in phase despite small perturbations caused by transient noise. In addition, LC oscillators are generally capable of performing at frequencies much higher than conventional prior art RC oscillators.

However, known prior art LC oscillators as well as other oscillators of the prior art have experienced problems in starting and stopping because of the finite time required to build up oscillation within the tuned circuit, including problems evident as frequency error during the startup segment.

An oscillator circuit used in a Shugart Associates Series SA-4000 disk drive is of particular interest because it is of the rapid startup type. In the Shugart circuit, a voltage controlled capacitor is employed to adjust the frequency of oscillation of a Colpitts-type oscillator in which feedback energy is introduced across a charge storage device. A voltage controlled capacitor (Varicap) forms a portion of another charge storing device and is used to adjust the frequency of oscillation of the circuit. The Shugart-type oscillator circuit has been found to be subject to uncontrolled frequency error during startup. The amount of frequency error is component dependent and thus varies from device to device in a practical system.

Referring to FIG. 1, a diagram of a prior art oscillator 10 is shown. The oscillator 10 is a Colpitts-type oscillator with a resonant tank circuit consisting of capacitors C1, C2, C3, voltage variable capacitor VVC1 and inductor L1. The conditions necessary for oscillation are provided by 180-degree phase reversal through a NAND gate 12 and a 180-degree phase reversal at resonance across the inductor L1. A transistor 14 in an emitter follower configuration couples a signal at high impedance from a node 16 to the relatively low impedance first input 18 of the NAND gate 12. A second input 20 of the NAND gate 12 is employed for injecting a control circuit for starting and stopping the oscillator 10.

The frequency of oscillation of the oscillator 10 is controlled by an error signal applied at an input node 22 which controls the bias across the voltage-variable capacitor VVC1. As a consequence of error voltage variation, the capacitance of VVC1 is varied, thereby changing the steady state oscillation frequency of the tank circuit according to well known principles.

One of the features of the oscillator 10 of the prior art is a mechanism for very rapid shutdown. For this purpose, a diode D1 is coupled between node 16 through a resistor R2 to the control input 20, and a load resistor R1 is coupled between the output of NAND gate 12 to the common node of inductor L1 and capacitor C1 in the tank circuit thereby to form a current loop which dissipates energy in the tank circuit when the diode D1 is forward biased.

However, the oscillator 10 is subject to undesired frequency variation during the transition following startup of oscillation. This condition is affected by the impedance of logic 1 level of the NAND gate output, the impedance of the base emitter junction in the transistor 14 and the impedance of the forward biased diode D1. The impedance values for resistors R1 and R2 are preferably chosen to provide a DC voltage at the node 16 which is the same as the average DC voltage during steady state operation of the oscillator 10. Any difference in the voltages between the OFF state and the ON state causes an undesired frequency transient during the transition between the states. In practice, it is very difficult to provide matched impedances in this circuit to assure the required condition at node 16. One of the significant problems is the undefined voltage at the logic 1 level of the NAND gate 12 inherent in practical NAND gates.

An intended feature of the oscillator 10 of the prior art is its ability to start rapidly. During the prestart condition, current is maintained in L1 through the current loop including forward-biased diode D1. At startup, the current through L1 is shut off causing the creation of a magnetic field which is useful in rapidly starting the oscillation of the resonant tank. Notwithstanding the features of the prior art oscillator 10, the inherent disadvantages suggest that improvements must be made to achieve more desirable results, such as stable frequency operation during the transition period following startup.

What is needed is a oscillator device which is capable of being started and stopped rapidly and of running at relatively high frequencies, on the order of 100 Megahertz and above, for use in data tracking applications. What is further needed is an oscillator in which frequency perturbations caused by startup transients is minimized. Still further, what is needed is an oscillator circuit which is substantially insensitive to component tolerances.

SUMMARY OF THE INVENTION

According to the invention, an LC type oscillator employs a differential amplifier to switch a tank circuit in response to a feedback signal. A voltage controlled variable capacitor is employed to control the frequency of oscillation. According to the invention, the bias across the variable capacitor is closely controlled to avoid errors in the frequency of oscillation during the period of oscillator startup, which would otherwise create an undesired error in the oscillation frequency.

Specifically, an LC oscillator circuit is provided having a voltage controlled variable capacitor which is coupled to a point in an LC tank circuit where the average DC voltage is constant regardless of circuit condition. Means are provided for switching the oscillator circuit on and off under external control.

One of the objects of the invention is to assure that the bias voltage level at a voltage controlled variable capacitor employed to control frequency of oscillation is the same during both the active and the inactive operational modes of the oscillator. In this manner, frequency perturbations caused by startup transients are minimized.

BRIEF DESCRIPTION OF THE DRAWINGS

The invention will be best understood by reference to the following detailed description taken in connection with the accompanying drawings in which:

FIG. 1 is a block diagram of a prior art variable frequency oscillator.

FIG. 2 is a schematic diagram of an oscillator according to the invention.

FIG. 3 shows waveform diagrams of signal generated during the operation of the circuit of FIG. 2 for illustrating timing relationships.

DESCRIPTION OF SPECIFIC EMBODIMENTS

Referring to FIG. 2, there is shown a diagram of an oscillator 30 according to the invention wherein a desirable steady state oscillation is achieved during the transition period following startup while still retaining desirable features of the prior art oscillator 10. For consistency identical or substantially identical circuit elements are designated by the identical numerals in each drawing.

The oscillator 30 includes a variable voltage capacitor (Varicap) VVC1 having one terminal which is AC-coupled through a capacitor C3 to ground and which is operative to receive a DC error signal through an input terminal 22 and input resistor R3. Nominal DC bias between input terminal 22 and a biasing node 40 is maintained by a biasing network 42 coupled to ground and low voltage $-V$. The biasing node 40 is AC-isolated through a capacitor C2 from a central node 34. One terminal of an inductor L1 is coupled to a fixed voltage source $+V$. The other terminal of inductor L1 is coupled to the central node 34. The central node 34 is AC-coupled to an output network in the form of a comparator 44 through a capacitor C4. The AC signal at the output terminal of the comparator 44 is of a frequency and a phase useful in the tracking of variable speed data as is known to the art.

According to the invention, means are provided for maintaining the central node 34 at a controlled bias level in all operating conditions of the oscillator 30, as hereinafter explained.

A differential pair, typically comprising matched first and second transistors 46 and 48 have emitters coupled in common to a resistor R4 coupled to low voltage $-V$. The differential pair provides feedback for sustaining oscillation during the normal oscillating condition of the oscillator 30. The collector of second transistor 48 is coupled to the central node 34. The base of second transistor 48 is connected to a node 38 whose nominal voltage level is determined by a bias network 50. Node 38 is connected to the bias network 50 through a resistor R5. The collector of first transistor 46 is connected to the high fixed voltage terminal $+V$ to which inductor L1 is connected. The base of first transistor 46 is coupled to a node 36 which is AC-coupled to the central node through a capacitor C5 and which is DC-coupled for bias to node 38 through a resistor R6. The voltage on node 36 will track variations in voltage at the central node 34.

The differential pair, i.e., first and second transistors, 46 and 48 provide feedback for the resonant tank circuit, which includes inductor L1 in order to sustain oscillation. The mechanism operates as follows. In the OFF state, a control signal applied at an input 33 through a switching diode D1 is normally forward biased to a relatively high voltage state to maintain high voltage at the junction of the emitters of first and second transistors 46 and 48 at node 32 relative to the nominal DC bias voltages at the bases of first and second transistors 46 and 48, namely at nodes 36 and 38, respectively. Voltage at central node 34 will be at $+V$, whereas voltage at nodes 36 and 38 will be at $-V_{BIAS}$, as set by the bias network 50.

Referring to FIGS. 2 and 3, upon switching of the control signal to the ON state, diode D1 becomes reverse biased, and the circuit, particularly central node 34, will begin to oscillate at the frequency determined by the time constant of the tank circuit including inductor L1, capacitors C2 and C3 and variable voltage capacitor VVC1. This oscillation develops as follows. When node 32 drops in voltage to a point where diode D1 becomes reverse biased, second transistor 48 begins to conduct because the base-emitter junction of second transistor 48 has become forward biased. Current is initially drawn through second transistor 48 within an amplitude envelope which increases logarithmically as energy builds up in the tank circuit of inductor L1, capacitors C2 and C3 and Varicap VVC1. The voltage at common node 34 will oscillate sinusoidally about the upper rail voltage +V, stabilizing at a maximum amplitude depending on the amount of current permitted through the differential pair of transistors 46 and 48. The first and second transistors 46 and 48 never achieve saturation as they are current limited by drive circuitry.

As current is initially drawn through second transistor 48, the voltage at central node 34 drops toward the voltage at node 32 as a back e.m.f. is developed across inductor L1. This voltage drop is fed back to the base node 36 of first transistor 46 through feedback capacitor C5 which tracks central node 34. Accordingly, the base node 36 drops below the voltage at common emitter node 32, reverse biasing first transistor 46.

As the current through inductor L1 stabilizes, the voltage at central node 34 begins to rise, which in turn is fed back to raise the voltage at base node 36 and to turn on first transistor 46 and to reverse bias second transistor 48 relative to node 38. Current stored in inductor L1 is reversed, creating a back e.m.f. raising the voltage at common node 34. The rate of change of the voltage, and thus the oscillation frequency, is controlled by the capacitance of the tank circuit, which in turn is modulated by the error signal at input 22 controlling the DC bias of the Varicap VVC1.

The tank circuit oscillates sinusoidally as current through emitter resistor R4 is switched between first and second transistors 46 and 48 in response to the signal fed back from central node 34. The average or DC voltage at central node 34 remains essentially constant so that the bias on Varicap VVC1 is constant, particularly during startup. Hence, the frequency of oscillation is stable during startup and throughout operation, terminating abruptly whenever the control input 33 forward biases diode D1.

The oscillator 30 according to the invention has an extremely fast startup characteristic, can maintain a stable frequency throughout startup and can track frequency changes determined solely by the value of the inductance and capacitance of the tank circuit. Capacitance is variable by changing the error voltage at node 22 which in turn changes the capacitance of variable voltage capacitor VVC1.

The invention has now been explained with reference to specific embodiments. Other embodiments may be suggested to the person of ordinary skill in the art in light of this description. For example, the control signal applied at 33 may be applied through a diode coupled to the central node 34 wherein the diode when it is in a forward biased, high voltage condition, is operative to stop oscillation. Similarly, the oscillator may be embodied in other forms such as in MOS form or with the use of PNP type transistors. It is therefore not intended that this invention be limited except as indicated by the appended claims.

I claim:

1. An oscillator circuit capable of minimizing frequency perturbations during starting up of said oscillator circuit, said oscillator circuit comprising:

a resonant tank circuit having a central node, said resonant tank circuit comprising at least one voltage variable capacitor and an inductor, said inductor having a first terminal and a second terminal, said first terminal being DC coupled to a fixed voltage source and coupled to said voltage variable capacitor, and said second terminal being DC coupled to said central node and coupled to said voltage variable capacitor;

means for providing positive feedback to said resonant tank circuit, said positive feedback providing means including first and second switching means, said first switching means comprising a first transistor, and said second switching means comprising a second transistor, said first transistor and said second transistor forming a differential pair having a common emitter node, said second transistor having a collector node coupled to said central node, said first transistor having a first base electrode and said second transistor having a second base electrode; and bias circuit means, said bias circuit means being coupled to said second base electrode to maintain a current bias and to said first base electrode to maintain a current bias, said bias circuit means including charge storage means coupled between said first base electrode and said central node to allow voltage at said second electrode to track voltage changes at said central node such that said bias circuit means maintains a controlled DC bias level at said central node at least during starting up of said oscillator circuit, thereby maintaining constant voltage bias of said voltage variable capacitor.

2. The oscillator circuit according to claim 1 comprising a diode coupled to said common emitter node of said differential pair, said diode, in a forward biased condition, being operative to switch oscillations of said oscillator circuit on and off.

3. The oscillator circuit according to claim 1 further comprising a diode coupled to said central node, said diode in a forward biased condition being operative to switch oscillations of said oscillator circuit on and off.

4. The oscillator circuit, according to claim 1 further including a first capacitor coupled between said voltage variable capacitor and said central node and a second capacitor coupled between said central node and an output terminal, said first capacitor and said second capacitor being operative to provide an AC signal path for energy of oscillation while blocking direct current.

5. The oscillator circuit according to claim 1 wherein said bias circuit means is adapted to limit current to said first base electrode and to said second base electrode such that said first transistor and said second transistor cannot achieve saturation.

* * * * *